United States Patent
Taylor et al.

(10) Patent No.: US 9,690,308 B2
(45) Date of Patent: Jun. 27, 2017

(54) SYSTEM AND METHOD FOR CONTROLLING OUTPUT RIPPLE OF DC-DC CONVERTERS WITH LEADING EDGE MODULATION CONTROL USING CURRENT INJECTION

(71) Applicants: Cirasys, Inc., Dallas, TX (US); Board of Regents, The University of Texas System, Austin, TX (US)

(72) Inventors: Robert Jewell Taylor, Allen, TX (US); Louis R. Hunt, Plano, TX (US); Vikas V. Paduvalli, Richardson, TX (US)

(73) Assignees: BOARD OF REGENTS, THE UNIVERSITY OF TEXAS SYSTEM, Austin, TX (US); CIRASYS, INC., Dallas, TX (US)

( * ) Notice: Subject to any disclaimer, the term of this patent is extended or adjusted under 35 U.S.C. 154(b) by 405 days.

(21) Appl. No.: 13/720,850

(22) Filed: Dec. 19, 2012

(65) Prior Publication Data
US 2013/0154586 A1    Jun. 20, 2013

Related U.S. Application Data

(60) Provisional application No. 61/578,137, filed on Dec. 20, 2011.

(51) Int. Cl.
*G05F 1/46* (2006.01)
*H02M 3/156* (2006.01)
(Continued)

(52) U.S. Cl.
CPC .............. *G05F 1/468* (2013.01); *H02M 1/14* (2013.01); *H02M 3/156* (2013.01); *H03K 7/08* (2013.01);
(Continued)

(58) Field of Classification Search
None
See application file for complete search history.

(56) References Cited

U.S. PATENT DOCUMENTS

| 4,630,187 A | 12/1986 | Henze |
| 4,677,366 A | 6/1987 | Wilkinson et al. |

(Continued)

FOREIGN PATENT DOCUMENTS

| WO | 2010148066 | 12/2010 |
| WO | 2012091850 | 7/2012 |

OTHER PUBLICATIONS

Doshi, Swarup Jayesh, "Analysis of Feedback Linearized DC-DC Boost and Buck-Boost Converters," PhD. Dissertation, University of Texas at Dallas, published Aug. 2011.*
(Continued)

*Primary Examiner* — Nguyen Tran
*Assistant Examiner* — Monica Mata
(74) *Attorney, Agent, or Firm* — Schultz & Associates, P.C.

(57) ABSTRACT

In a preferred embodiment, a voltage converter comprises a voltage converter circuit, an output adjuster and a controller. The controller provides a control signal at a duty ratio determined dynamically by a set of input signals. The dynamic output adjuster determines the set of input signals by adjusting the ac component of an output voltage based on a gain Q. The dynamic output adjuster alleviates dependence on the value of $R_c$ under leading edge modulation in either analog or digital converter systems. In addition to delivering the desired left half plane zero effects, dynamic output adjustment reduces the value of the output ripple. As a result, modern control methods such as input-output linearization can be used to design both boost and buck-boost PWM converters if only left half plane zero effects are present.

13 Claims, 5 Drawing Sheets

(51) Int. Cl.
  *H03K 7/08* (2006.01)
  *H02M 1/14* (2006.01)
  *H02M 3/157* (2006.01)
  *H02M 1/00* (2006.01)
(52) U.S. Cl.
  CPC .... *H02M 3/157* (2013.01); *H02M 2001/0025* (2013.01)

(56) References Cited

U.S. PATENT DOCUMENTS

| | | | |
|---|---|---|---|
| 4,929,882 A | 5/1990 | Szepesi | |
| 5,138,250 A | 8/1992 | Capel | |
| 5,311,421 A | 5/1994 | Nomura et al. | |
| 5,442,534 A | 8/1995 | Cuk et al. | |
| 5,477,132 A | 12/1995 | Canter et al. | |
| 5,708,433 A | 1/1998 | Craven | |
| 5,747,942 A * | 5/1998 | Ranganath | 315/224 |
| 5,804,950 A | 9/1998 | Hwang et al. | |
| 5,886,586 A | 3/1999 | Lai et al. | |
| 5,920,471 A | 7/1999 | Rajagopalan et al. | |
| 5,943,224 A | 8/1999 | Mao | |
| 6,084,450 A | 7/2000 | Smith et al. | |
| 6,366,070 B1 | 4/2002 | Cooke et al. | |
| 6,396,725 B1 * | 5/2002 | Jacobs et al. | 363/131 |
| 6,407,515 B1 | 6/2002 | Hesler et al. | |
| 6,462,962 B1 | 10/2002 | Cuk | |
| 6,538,905 B2 | 3/2003 | Greenfeld et al. | |
| 6,545,887 B2 | 4/2003 | Smedley et al. | |
| 6,674,272 B2 | 1/2004 | Hwang | |
| 6,956,360 B2 | 10/2005 | Matsuura et al. | |
| 7,103,425 B1 | 9/2006 | Marra, III et al. | |
| 7,239,257 B1 | 7/2007 | Alexander et al. | |
| 7,482,794 B2 | 1/2009 | Hunt et al. | |
| 7,489,186 B2 | 2/2009 | Segarra | |
| 7,495,423 B1 * | 2/2009 | Knight | H02M 3/1582 323/259 |
| 7,602,166 B1 | 10/2009 | Kang | |
| 7,812,586 B2 | 10/2010 | Soldano et al. | |
| 7,851,941 B2 | 12/2010 | Walley | |
| 8,130,522 B2 | 3/2012 | Maksimovic | |
| 2001/0030879 A1 | 10/2001 | Greenfield et al. | |
| 2003/0090253 A1 | 5/2003 | Balakrishnan | |
| 2003/0199997 A1 | 10/2003 | Gao | |
| 2003/0222627 A1 | 12/2003 | Hwang | |
| 2003/0227280 A1 * | 12/2003 | Vinciarelli | 323/265 |
| 2006/0158910 A1 | 7/2006 | Hunt et al. | |
| 2007/0046105 A1 | 3/2007 | Johnson et al. | |
| 2007/0236200 A1 | 10/2007 | Canfield et al. | |
| 2008/0164859 A1 * | 7/2008 | Peng et al. | 323/318 |
| 2008/0252279 A1 * | 10/2008 | Wang | 323/283 |
| 2010/0141225 A1 | 6/2010 | Isham et al. | |
| 2010/0164282 A1 | 7/2010 | Tseng et al. | |
| 2010/0320978 A1 | 12/2010 | Hunt et al. | |
| 2012/0139509 A1 * | 6/2012 | Hunt et al. | 323/234 |
| 2012/0146596 A1 | 6/2012 | Lin et al. | |
| 2013/0301321 A1 | 11/2013 | Hunt | |

OTHER PUBLICATIONS

Hunt, L. R., et al., "Global transformations of nonlinear systems," IEEE Transactions on Automatic Control, 28 (1983), 24-31.
Sable, Dan M., et al., "Elimination of the positive zero in fixed frequency boost and flyback converters," Proceedings of 5th IEEE Applied Power Electronics Conference, (1990).
Taylor, Robert J., "Feedback Linearization of Fixed Frequency PWM Converters," Ph.D. Dissertation, University of Texas at Dallas, published Nov. 2005.
R. Ridley, "11 ways to generate multiple outputs", Switching Power Magazine, 2005.
D. Ma and R. Bondade, "Enabling power-efficient DVFS Operations in Silicon", IEEE Circuits and Systems Magazine, First Quarter, 2010, 14-30.
G. Meyer, L. R. Hunt, and R. Su, "Nonlinear System Guidance in the Presence of Transmission Zero Dynamics", NASA Technical Memorandum 4661, Jan. 1995.
R. D. Middlebrook and S. Cuk, "A general unified approach to modeling switching-converter power stages", IEEE Power Electronics Specialists Conference Record, Jun. 1976, 18-34.
Slotine, et al., "Applied Nonlinear Control," Prentice-Hall, Inc., Englewood Cliffs, 1991.
Su, R., "On the Linear Equivalents of Nonlinear Systems," Systems and Control Letters 2, (1982), 48-52.
Su, et al., "Linear Equivalents of Nonlinear Time-Varying Systems," International Symposium on Mathematical Theory of Networks and Systems (1981), 119-123.
Su, et al., "Robustness in Nonlinear Control," Differential Geometric Control Theory, Birkhauser, Boston, R. W. Brockett, R. S. Millman, and H. J. Sussman, Eds., (1983), 316-337.
Tang, Wei, "Average Current-Mode Control and Charge Control for PWM Converters," Ph. D. Dissertation, Virginia Polytechnic Institute and State University (1994).
Bodson, et al., "Differential-Geometric Methods for Control of Electric Motors," Int. J. of Robust and Nonlinear Control 8, (1998), pp. 923-954.
Cuk, "Modelling, Analysis, and Design of Switching Converters," Dissertation, California Institute of Technology (1977), 317 pages.
Deisch, C.W., "Simple Switching Control Method Changes Power Converter into a Current Source," IEEE Power Electronics Specialists Conference, 1978 Record, pp. 300-306.
Hunt, et al., "Design for Multi-Input Nonlinear Systems," Differential Geometric Control Theory, Birkhauser, Boston, R. W. Brockett, R. S. Millman, and H. J. Sussman, Eds., (1983), 268-298.
Isidori, A. "Nonlinear Control Systems," 3rd Ed, Springer-Verlag London Limited (1995).
Meyer, et al., "Applications of Nonlinear Transformations to Automatic Flight Control," Automatica, 20 (1984), 103-107.
Mitchell, D. M., "DC-DC Switching Regulator Analysis, Reprint Edition," D.M. Mitchell Consultants, McGraw-Hill, Inc. (1988).
Ridley, "A New Small-Signal Model for Current-Mode Control," Ph. D. Dissertation, Virginia Polytechnic Institute and State University (1990) 15 pages.
Sanders, "Nonlinear Control of Switching Power Converters," Ph.D. Dissertation, Massachusetts Institute of Technology (1989) 254 pages.
Shortt, Daniel J., "An Improved Switching Converter Model," Ph.D. Dissertation, Virginia Polytechnic Institute and State University (1982).
Sira-Ramirez, et al., "Exact Linearization in Switched Mode DC-to-DC Power Converters," Int. J. Control, 50 (1989), pp. 511-524.
Sira-Ramirez, "Switched Control of Bilinear Converters Via Pseudolinearization," IEEE Transactions on Circuits and Systems, vol. 36, No. 6, Jun. 1989, 8 pages.
Taylor, Robert J., "Feedback Linearization of Fixed Frequency PWM Converters," Revised Ph.D. Dissertation, University of Texas at Dallas, (undated), 174 pages.

* cited by examiner

SYSTEM AND METHOD FOR CONTROLLING OUTPUT RIPPLE OF DC-DC CONVERTERS WITH LEADING EDGE MODULATION CONTROL USING CURRENT INJECTION

CROSS-REFERENCE TO RELATED APPLICATIONS

This application claims priority benefit from U.S. Provisional Patent Application No. 61/578,137 filed Dec. 20, 2011.

FIELD OF THE INVENTION

The present invention relates generally to providing modulation signals to electrical circuits and, more particularly, to a system and method for controlling output ripple of DC/DC converters with leading edge modulation ("LEM") control.

BACKGROUND OF THE INVENTION

Power converters are used to convert one form of energy to another (e.g., AC to AC, AC to DC, DC to AC, and DC to DC) thereby making it usable to the end equipment, such as computers, automobiles, electronics, telecommunications, space systems and satellites, and motors. Every application of power electronics involves some aspect of control. Converters are typically identified by their capability and/or configurations, such as, buck converters, boost converters, buck-boost converters, boost-buck converters (Ćuk), etc. For example, DC-DC converters belong to a family of converters known as "switching converters" or "switching regulators." This family of converters is the most efficient because the conversion elements switch from one state to another, rather than needlessly dissipating power during the conversion process. Essentially there is a circuit with switches and two configurations (each can be modeled as linear systems) in which the converter resides according to the switch positions. The duty ratio (d) is the ratio indicating the time in which a chosen switch is in the "on" position while the other switch is in the "off" position, and this d is considered to be the control input. Input d is usually driven by pulse-width-modulation ("PWM") techniques.

Switching from one state to another and the accompanying nonlinearity of the system causes problems. State space averaging reduces the switching problems to make the system, in general, a nonlinear averaged system for a boost converter or a buck-boost converter. But, control of the system under these nonlinear effects becomes difficult when certain performance objectives must be met. Linearization is mostly accomplished through a Taylor series expansion. Nonlinear terms of higher orders are thrown away and a linear approximation replaces the nonlinear system. This linearization method has proven effective for stabilizing control loops at a specific operating point. However, use of this method requires making several assumptions, one of them being so-called "small signal operation." This works well for asymptotic stability in the neighborhood of the operating point, but ignores large signal effects which can result in nonlinear operation of the control loop when, for example, an amplifier saturates during startup, or during transient modes, such as load or input voltage changes. Once nonlinear operation sets in, the control loop can have equilibrium points unaccounted for in the linearization.

One of the most widely used methods of pulse-width modulation is trailing-edge modulation ("TEM"), wherein the on-time pulse begins on the clock and terminates in accordance with a control law. Unstable zero dynamics associated with TEM with switch on-time sampling in the continuous conduction mode ("CCM") prevent the use of an input-output feedback linearization because it would result in an unstable operating point for boost and buck-boost converters. The other control method is LEM, wherein the on-time pulse begins in accordance with a control law and terminates on the clock. The difference between LEM and TEM is that in TEM the pulse-width is determined by the instantaneous control voltage $v_c$ prior to switch turn-off, whereas in LEM the pulse-width is determined by $v_c$ prior to switch turn-on.

Further, it is well known in the art that pulse-width modulation ("PWM") boost and buck-boost power converters exhibit right half plane zero effects when trailing edge modulation with on time switch sampling is employed. This makes control design extremely difficult. It has been shown that if leading edge modulation with off time switch sampling is used with a sufficiently large equivalent series resistance ("ESR") $R_c$ of the output capacitor, then left half plane zero effects emerge. This enables much easier control design.

Therefore, there is a need for a system and method for controlling ripple of DC-DC converters with LEM control to alleviate dependence on the value of $R_c$ under LEM in either analog or digital converter systems while delivering left plane zero effects.

SUMMARY OF THE INVENTION

The present disclosure includes a voltage converter controlled by applying a control signal based on an adjusted output voltage of a voltage converter circuit. The adjusted output voltage depends on inductor current ripple in an inductor of the voltage converter circuit.

In a preferred method of voltage conversion an input voltage is converted into an output voltage by providing a voltage converter circuit having the input voltage as a voltage source and producing the output voltage across a load resistance. An inductor current flows through an inductor in the voltage converter circuit, the inductor current having a steady-state component and a time varying component. An output adjuster is connected to the voltage converter circuit, the output adjuster generating an adjusted output voltage which depends on the output voltage and the time varying component of the inductor current scaled by a first gain factor. A controller is connected to the output adjuster and to the voltage converter circuit, the controller generating a control signal with a duty ratio that controls the voltage converter circuit. The duty ratio is dynamically determined from the adjusted output voltage, the input voltage, a desired output voltage, a second gain factor, the inductor current and the first gain factor. The voltage converter circuit operates to match the output voltage to the desired output voltage.

In a preferred embodiment, the adjusted output voltage is a linear function of the time varying component of the inductor current.

In a preferred embodiment, the control signal is determined based on leading edge modulation of the voltage converter circuit and the control signal is based on input-output feedback linearization of a set of state variables with stable zero dynamics, where the set of state variables includes the adjusted output voltage. However, any suitable control method is compatible with the method.

In further aspect of the present disclosure, the controller utilizes proportional, integral and derivative gain for the second gain.

In a first embodiment, the voltage converter comprises a boost converter circuit, an output adjuster and a controller. A suitable duty ratio is generated by the controller and applied to the boost converter based on an adjusted output voltage from the output adjuster where the adjusted output voltage is determined from the output voltage of the boost converter and an inductor current ripple.

In a second embodiment, the voltage converter comprises a buck-boost converter circuit, an output adjuster and a controller. A suitable duty ratio is generated by the controller and applied to the buck-boost converter based on an adjusted output voltage from the output adjuster where the adjusted output voltage is determined from the output voltage of the buck-boost converter and an inductor current ripple.

In a third embodiment, the voltage converter comprises a buck converter circuit, an output adjuster and a controller. A suitable duty ratio is generated by the controller and applied to the buck converter based on an adjusted output voltage from the output adjuster where the adjusted output voltage is determined from the output voltage of the buck converter and an inductor current ripple.

DETAILED DESCRIPTION

In the disclosed embodiments of a boost and a buck-boost converter with PWM control, the inductor current is measured and a difference current is formed between the measured inductor current and a measured output current. The difference current represents an inductor current ripple, which is further scaled and then injected into the converter state equations. A method for altering the converter state equations based on inductor current ripple is disclosed.

In a preferred embodiment, the method of the present disclosure can be used to alleviate dependence on the value of output capacitor equivalent series resistance ("ESR") ($R_c$) when used with leading edge modulation ("LEM") and switch off time sampling in either analog or digital converter systems.

Figure 1:
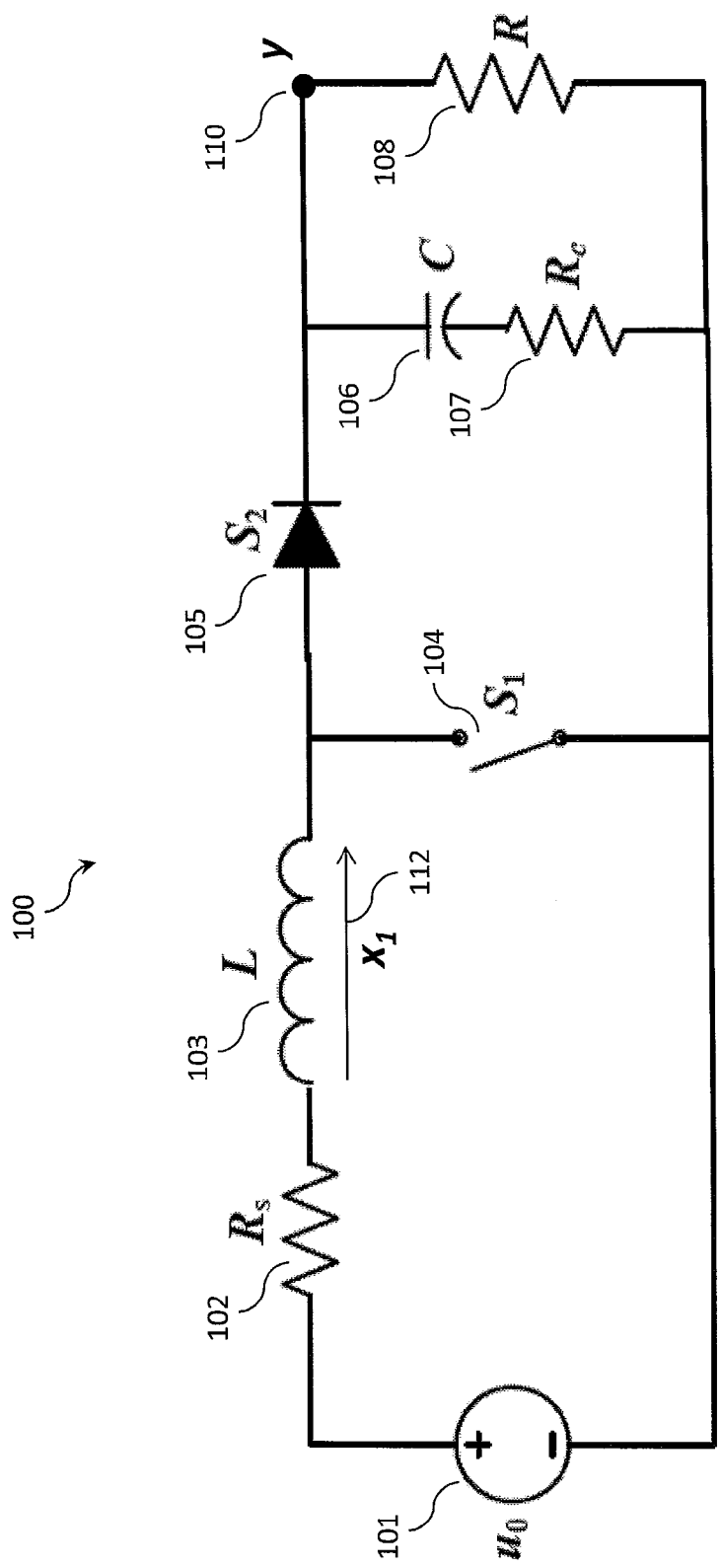
FIG. 1 is a circuit diagram of a boost converter of a preferred embodiment.

FIG. 1 illustrates a preferred embodiment boost converter circuit 100 having a single output voltage 110 ($y$). The boost converter comprises a series resistor 102 ($R_s$) connected in series with an inductor 103 (L), a switch 104 ($S_1$) and a DC voltage input 101 ($u_0$). A capacitive circuit comprises a switch 105 ($S_2$), connected in series to inductor 103, further connected in series to a capacitor 106 (C) and DC series resistance 107 ($R_c$) associated with capacitor 106. Load resistance 108 (R) is connected in parallel with capacitor 106 and DC series resistance 107. Output voltage 110 ($y$) is taken across load resistance 108. The inductor current 112 ($x_1$) is measured as the current through inductor 103 and series resistor 102.

Figure 2:
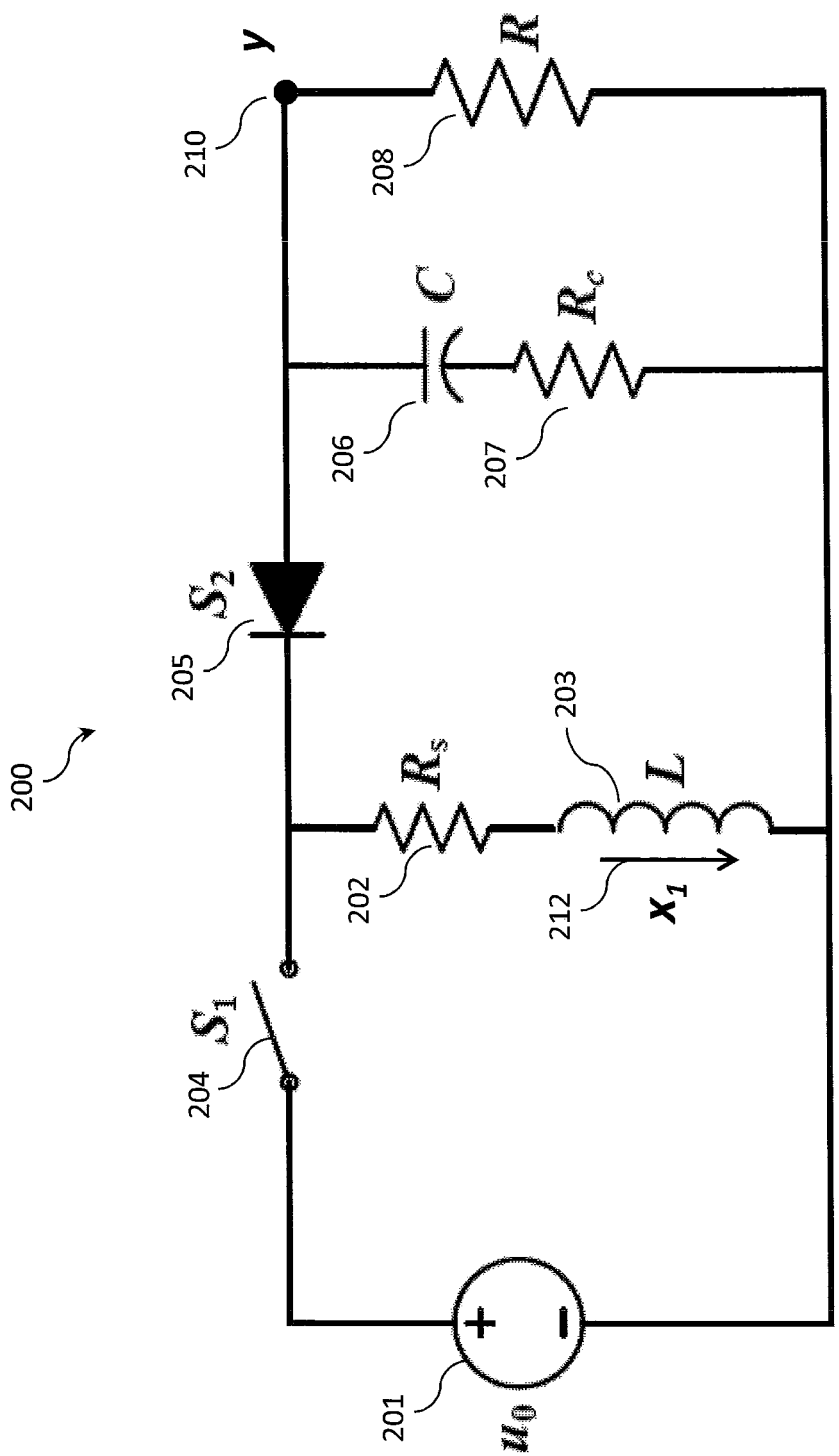
FIG. 2 is a circuit diagram of a buck-boost converter of a preferred embodiment.

FIG. 2 illustrates a preferred embodiment buck-boost converter circuit 200 having a single output voltage 210 ($y$). The buck-boost converter comprises a switch 204 ($S_1$) connected in series with series resistor 202 ($R_s$) which is further connected to an inductor 203 (L). Inductor 203 and switch 204 are connected to DC voltage input 201 ($u_0$) to complete a series circuit. A capacitive circuit comprises a switch 205 ($S_2$) connected between switch 204 and a capacitor 206 (C), and further connected in series with DC series resistance 207 ($R_c$) associated with capacitor 206. Load resistance 208 (R) is connected in parallel with the capacitor 206 and DC series resistance 207. Output voltage 210 ($y$) is taken across load resistance 208. The inductor current 212 ($x_1$) is measured as the current through inductor 203 and series resistor 202.

Figure 3:
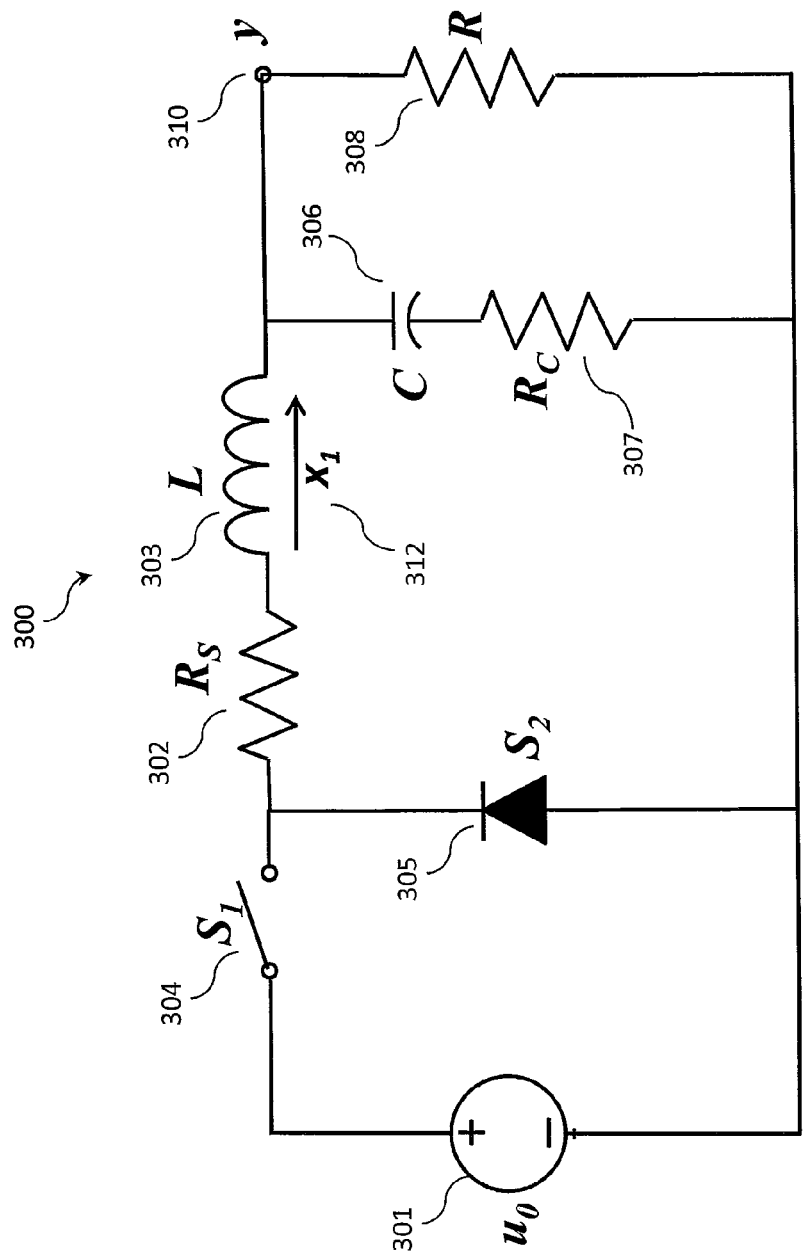
FIG. 3 is a circuit diagram of a buck converter of a preferred embodiment.

FIG. 3 illustrates a preferred embodiment buck converter circuit 300 having a single output voltage 310 ($y$). The buck converter comprises a switch 304 ($S_1$) connected in series with a series resistor 302 connected to inductor 303 (L) which is further connected to load resistance 308 (R). Switch 304 and load resistance 308 further connect to DC voltage input 301 ($u_0$) to complete a series circuit. A switch 305 ($S_2$) is connected between switch 304 and DC voltage input 301. A capacitive circuit is connected in parallel with load resistance 308 and comprises a capacitor 306 (C) connected to a DC series resistance 307 ($R_c$) associated with capacitor 306. The output voltage 310 ($y$) is taken across load resistance 308. The inductor current 312 ($x_1$) is measured as the current through inductor 303 and series resistor 302.

In general, for the boost, buck-boost and buck voltage converter circuits, the system is characterized by the state equations for state variables $x_1$ (inductor current), $x_2$ (capacitor voltage) and y (output voltage). A control signal is applied to the ($S_1$) switch characterized by its instantaneous duty ratio d. The steady-state output voltage of a boost voltage converter is $1/(1-D)$ times the input voltage where D is the steady-state value of the instantaneous duty ratio d. The steady-state output voltage of a buck-boost converter is $D/(1-D)$ times the input voltage and the steady-state output voltage of a buck converter is D times the input voltage.

Figure 4:
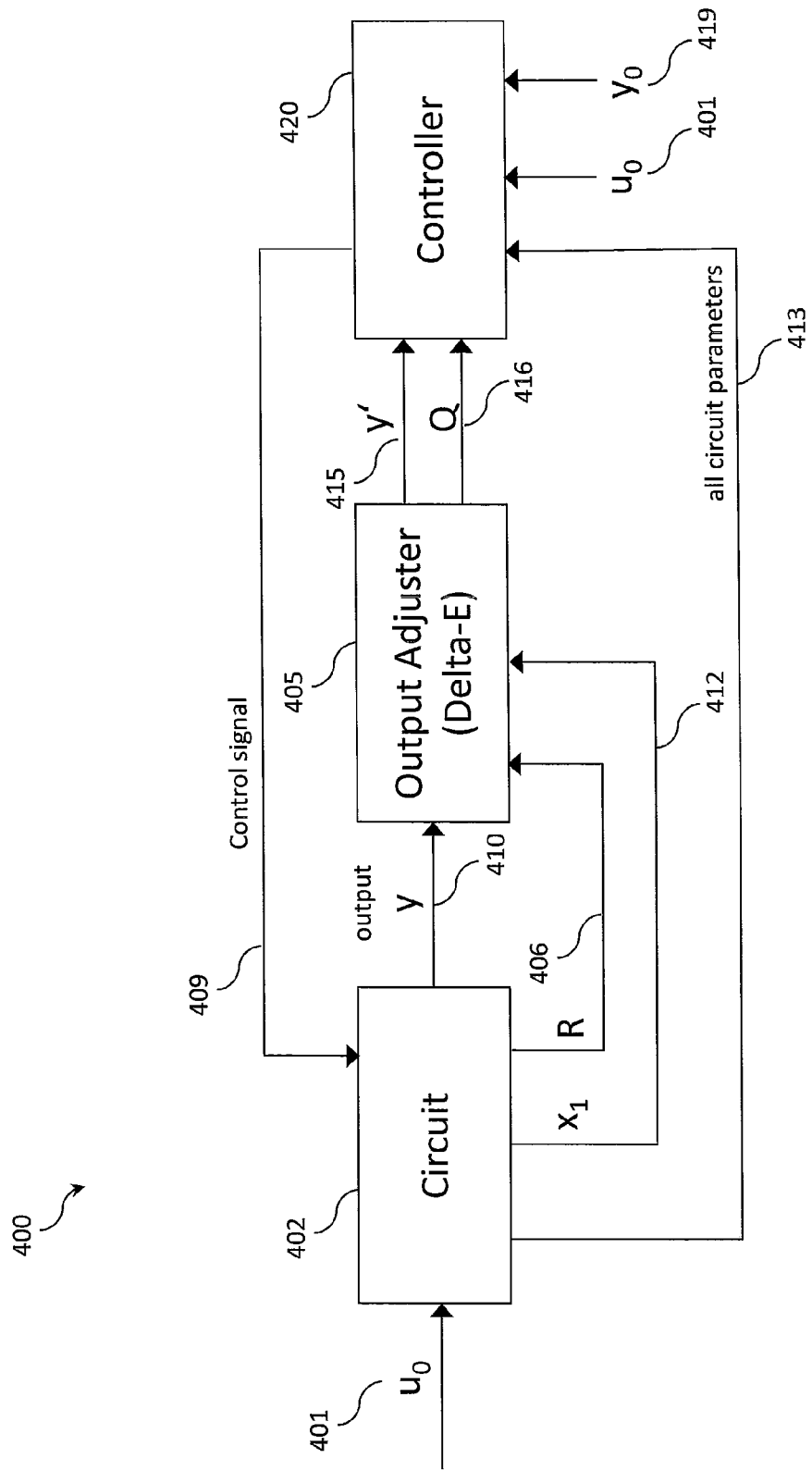
FIG. 4 is a block diagram of a preferred embodiment of a voltage converter including a converter circuit, an output adjuster and a controller.

FIG. 4 shows a preferred embodiment of a control circuit 400 suitable for controlling the voltage converter circuits of FIGS. 1, 2 and 3. Control circuit 400 is amenable to input-output linearization methods that do not constrain stability to one operating point, but rather to a set of operating points spanning the expected range of operation during startup and transient modes of operation. A voltage converter circuit 402 is connected to a DC input voltage 401 ($u_0$) and produces output voltage 410 ($y$) in response to control signal 409 characterized by the duty ratio d. An output adjuster circuit 405 senses load resistance 406 (R) and inductor current 412 ($x_1$) of voltage converter circuit 402 to adjust output voltage 410 to an adjusted output voltage 415 ($y'$) according to a deltaE gain factor 416 (Q). Adjusted output voltage 415 and deltaE gain factor 416 is communicated to controller 420. Controller 420 produces control signal 409 from adjusted output voltage 415, deltaE gain factor 416, DC input voltage 401, a desired output voltage 419 ($y_0$) and circuit parameters 413 including, for example, the load resistance R and the inductor current $x_1$. Controller 420 adjusts control signal 409 to match output voltage 410 to desired output voltage 419.

Controller 420 and output adjuster 405 are preferably implemented in one or more digital devices, implemented with programmable software instructions stored in memory and executed by a processor to carry out the converter control functions including output adjustment. In alternate embodiments, an analog implementation is used instead of a digital implementation. The output adjuster methods as described below are then implemented as hardware functions, including analog adders and multipliers.

Controller 420 can implement any desired control method. For example, a pulse width modulated (PWM) controller is suitably constructed. The PWM controller produces the control signal which drives the switch ($S_1$) of a voltage converter with the duty ratio d.

Voltage converters operating in the continuous conduction mode with trailing edge modulation (TEM) and switch on-time sampling give rise to unstable zero dynamics for boost and buck-boost converters where the linear segment of the system about an operating point has a right half plane zero. In a preferred control embodiment, leading-edge modulation (LEM) with switch off time sampling is implemented by controller 420 that changes the zero dynamics, so that the linear part of the system has only left half plane zeros. Since the resulting nonlinear system possesses stable zero dynamics, input-output feedback linearization can be employed wherein a linearizing transformation is performed and used to define control signal inputs to a converter. This transformation is local in nature, but it can be applied in a neighborhood of any state space operating point for multiple DC-DC conversions.

In a preferred embodiment of a boost converter, boost converter circuit 100 is substituted for voltage converter circuit 402, and controller 420 uses LEM with switch off time sampling of the state variables. When output adjuster is off, Q=0, y'=y, and the dynamic state equations for the boost converter are $$\dot{x}_1 = \frac{u_0}{L} - \frac{Rx_2}{L(R+R_c)} - \left[R_s + \frac{RR_c}{(R+R_c)}\right]\frac{x_1}{L} + \quad \text{(Eqs. 1)}$$

$$\frac{R}{L(R+R_c)}[R_c x_1 + x_2]d$$

$$\dot{x}_2 = -\frac{1}{C(R+R_c)}x_2 + \frac{R}{C(R+R_c)}[x_1(1-d)]$$

$$y = \frac{R}{R+R_c}[R_c x_1 + x_2]$$

where $x_1$ is the inductor current, $x_2$ is the voltage across capacitor C, $u_0$ is the input voltage, y is the output voltage and duty ratio d is the instantaneous duty ratio of the control signal. The dot above a variable means the time derivative of the variable.

Given a desired output voltage $y_0$, the equations $\dot{x}_1=0$, $\dot{x}_2=0$ and $y=y_0$ are solved to find the corresponding steady-state values $x_{10}$, $x_{20}$, with steady-state duty ratio D. The state space equilibrium point is ($x_{10}$, $x_{20}$); asymptotically stabilizing the system to this equilibrium point sends y asymptotically to $y_0$.

Next, a Taylor series linearization is performed on Eqs. 1 about $x_{10}$, $x_{20}$, and D. Using the approximations $$R_s = 0,$$

$$R_c^2 = 0,$$

$$x_{10} = \frac{u_0}{(1-D)^2 R},$$

and $$x_{20} = \frac{u_0}{(1-D)},$$

the resulting transfer function has a zero in the open left half plane if and only if:

$$R_c C > \frac{L}{R(1-D)}. \quad \text{(Eq. 4)}$$

This is the well-known Ridley condition for the boost converter.

Under the Ridley condition, the input-output feedback linearization is employed using proportional control, generally with controller gain factor k>0. The input-output feedback linearization yields the formula for duty ratio d:

$$d = \frac{(RR_C C + L)y - (L - R_S R_C C)Rx_1 - RR_C Cu_0 + (R + R_C)LCk(y_0 - y)}{R\left(R_C Cy - \frac{LR}{R+R_C}x_1\right)}. \quad \text{(Eq. 5)}$$

The Ridley condition holds if the denominator is positive and the approximations $$x_1 = \frac{y}{R(1-D)}$$

and $$\frac{R}{R+R_c} = 1$$

are valid in Eq. 5.

Generally, integral and derivative gain can also be implemented by the controller so that the controller gain factor takes the form $$k = (k_p + k_i/s + k_d s), \quad \text{(Eq. 6)}$$

where $k_p$, $k_i$, and $k_d$ are the gains of the proportional, integral, and derivative terms of the controller and s is a complex variable. For example, an integral gain can be included to reduce steady state error.

When the output adjuster is on with deltaE gain factor Q>0, the output adjuster changes the output y' used by the controller for control purposes according to $$y' = y + Q\left(x_1 - \frac{y}{R}\right) \quad \text{(Eq. 7)}$$

where y is the output voltage in the state equations (Eqs. 1). $x_1$ represents the AC+DC terms of inductor current. Since $$\left(\frac{y}{R}\right)$$

is equal to the DC term near steady state, $$\left(x_1 = \frac{y}{R}\right)$$

represents the AC term which is the inductor ripple current. The output adjuster does not change the DC component of output voltage y of the physical plant which matches the desired output voltage $y_0$: instead the output adjuster changes the signal presented to the controller which affects the dynamics of the output voltage y.

The state equations, modified by the output adjuster with Q>0, become:

$$\dot{x}_1 = \frac{u_0}{L} - \frac{Rx_2}{L(R+R_c)} - \left[R_s + \frac{RR_c}{(R+R_c)}\right]\frac{x}{L} + \quad \text{(Eqs. 8)}$$

$$\frac{R}{L(R+R_c)}[R_c x_1 + x_2]d$$

$$\dot{x}_2 = -\frac{1}{C(R+R_c)}x_2 + \frac{R}{C(R+R_c)}[x_1(1-d)]$$

$$y' = \frac{1}{R+R_c}[R(R_c+Q)x_1 + (R-Q)x_2].$$

A Taylor series linearization is performed on Eqs. 8 about the steady state $x_{10}$, $x_{20}$ and D resulting in a transfer function G(s), using the approximations $$R_s = 0,$$

$$x_{10} = \frac{u_0}{(1-D)^2 R},$$

and $$x_{20} = \frac{u_0}{(1-D)}.$$

With the further approximations: $R_c^2=0$ and $R_cQ=0$, and with the additional assumption that R>Q, it is easily shown that the transfer function G(s) has a zero in the open left half plane if and only if $$(R_c+Q)C > \frac{\left(1-\frac{Q}{R}\right)L}{R(1-D)}. \quad \text{(Eq. 9)}$$

Eq. 9 is the Ridley condition for a boost converter modified by an output adjuster with Q chosen so that R>Q. From Eq. 9, the output adjustment has a least two implications. First, the value of $R_c$ required by the usual Ridley condition is lowered. Second, the output ripple due to $R_c$ is reduced.

When the Ridley condition in Eq. 9 holds, then input-output linearization is used to design the control condition for a boost converter. Using a controller with controller gain factor k>0, the input-output linearization results in a duty ratio $$d = \frac{-Py' - Sx_1 - Uu_0 - k(y'-y_0')}{V} \quad \text{(Eq. 10)}$$

where $$y_0' = y_0\left(1 + \frac{QD}{R(1-D)}\right),$$

$$P = -\frac{1}{R+R_c}\left[\frac{R^2(R_c+Q)}{L(R-Q)} + \frac{1}{C}\right],$$

$$S = \frac{R}{(R+R_c)^2}\left[\frac{(R_c+Q)}{L}(-R_s(R+R_c) - RR_c) + \frac{(R+R_c)}{C} + R^2\frac{(R_c+Q)^2}{L(R-Q)}\right],$$

$$U = \frac{R}{L(R+R_c)}(R_c+Q),$$

and $$V = \frac{R}{(R+R_c)^2}\left[-\left(\frac{R(R_c+Q)Q(R+R_c)}{L(R-Q)} + \frac{(R-Q)}{C}\right)x_1 + \frac{R(R_c+Q)(R+R_c)}{L(R-Q)}y'\right].$$

As output voltage ripple increases (or decreases) at particular desired output voltage $y_0$, higher (or lower) then the value of Q can be adjusted to stabilize the system.

In a preferred embodiment, the duty ratio d of Eq. 10 is applied as the control signal for the boost converter. In other embodiments, various approximations to Eq. 10 can be used to determine the duty ratio d for the control signal.

In one embodiment of the boost converter, a first approximation, including $R_c^2=0$, $R_cQ=0$ and $Q^2=0$, is applied to Eq. 10 to arrive at a duty ratio d given by the formula:

$$\frac{\left[\frac{R^2}{(R-Q)}(R_c+Q)C + L)y' - (L - R_s(R_c+Q)C)Rx_1 - R(R_c+Q)Cu_0 + (R+R_c)LCk(y_0'-y')\right]}{R\left(\frac{R}{(R-Q)}(R_c+Q)Cy' - L\frac{(R-Q)}{(R+R_c)}x_1\right)}. \quad \text{(Eq. 11)}$$

In another embodiment of the boost converter, a second approximation including $$\frac{R}{R-Q} = 1$$

is applied to Eq. 11 to arrive at a duty ratio d given by the formula:

$$\frac{\left[R(R_c+Q)C + L)y' - (L - R_s(R_c+Q)C)Rx_1 - R(R_c+Q)Cu_0 + (R+R_c)LCk(y_0'-y')\right]}{R\left((R_c+Q)Cy' - L\frac{R}{(R+R_c)}x_1\right)}. \quad \text{(Eq. 12)}$$

Eq. 12 is valid when Q<<R.

In another set of embodiments of a boost converter, Q is replaced by $$Q \to \frac{R}{(R+R_c)}Q, \quad \text{(Eq. 13)}$$

in Eq. 10, Eq. 11 and Eq. 12 to determine the duty ratio d and the adjusted output voltage is replaced by $$y' = y + \frac{R}{(R+R_c)} Q\left(x_1 - \frac{y}{R}\right). \quad \text{(Eq. 14)}$$

In these embodiments, Q is chosen so that $Q<(R+R_c)$.

In a preferred embodiment of a buck-boost converter, buck-boost converter circuit 200 is substituted for voltage converter circuit 402, and controller 420 uses LEM with switch off time sampling of the state variables. When output adjuster is off, $Q=0$, $y'=y$, and the dynamic state equations for the boost converter are $$\dot{x}_1 = -\frac{Rx_2}{L(R+R_c)} - \left[R_s + \frac{RR_c}{(R+R_c)}\right]\frac{x_1}{L} + \quad \text{(Eqs. 15)}$$

$$\frac{R}{L(R+R_c)}[R_c x_1 + x_2]d + \frac{u_0}{L}d$$

$$\dot{x}_2 = -\frac{1}{C(R+R_c)}x_2 + \frac{R}{C(R+R_c)}[x_1(1-d)]$$

$$y = -\frac{R}{R+R_c}[R_c x_1 + x_2]$$

where $x_1$ is the inductor current, $x_2$ is the voltage across capacitor C, $u_0$ is the input voltage, y is the output voltage and duty ratio d is the instantaneous duty ratio of the control signal. The dot above a variable means the time derivative of the variable.

Given a desired output voltage $y_o$, the equations $\dot{x}_1=0$, $\dot{x}_2=0$ and $y=y_0$ are solved to find the corresponding steady-state values $x_{10}$, $x_{20}$, with steady-state duty ratio D. The state space equilibrium point is $(x_{10}, x_{20})$; asymptotically stabilizing the system to this equilibrium point sends y asymptotically to $y_0$.

Next, a Taylor series linearization is performed on Eqs. 15 about $x_{10}$, $x_{20}$, and D. Using the approximations $$R_s = 0,$$
$$R_c^2 = 0,$$
$$x_{10} = \frac{u_0}{(1-D)^2 R}$$

and $$x_{20} = \frac{u_0}{(1-D)},$$

the resulting transfer function has a zero in the open left half plane if and only if:

$$R_c C > \frac{LD}{R(1-D)}. \quad \text{(Eq. 16)}$$

This is the Ridley condition for the buck-boost converter.

Under the Ridley condition, the input-output feedback linearization is employed using proportional control, generally with proportional, integral and derivative gain with controller gain factor $k>0$. The input-output feedback linearization yields the formula for duty ratio d:

$$d = \frac{(RR_C C + L)y + (L - R_S R_C C)Rx_1 +}{R\left(R_C Cy + \frac{LR}{R+R_C}x_1 - R_C Cu_0\right)}. \quad \text{(Eq. 17)}$$

The Ridley condition holds if the denominator is negative and the approximations $$x_1 = -\frac{y}{R(1-D)},$$

$$u_0 = -y\frac{(1-D)}{D},$$

and $$\frac{R}{R+R_c} = 1$$

are valid in Eq. 17.

Generally, integral and derivative gain can also be implemented by the controller so that the controller gain factor takes the form $$k = (k_p + k_i/s + k_d s), \quad \text{(Eq. 18)}$$

where $k_p$, $k_i$, and $k_d$ are the gains of the proportional, integral, and derivative terms of the controller and s is a complex variable. For example, an integral gain can be included to reduce steady state error.

When the output adjuster is on with deltaE gain factor $Q>0$, the output adjuster changes the output y' used by the controller for control purposes according to $$y' = y + Q\left(x_1 + \frac{y}{R}\right) \quad \text{(Eq. 19)}$$

where y is the output voltage in the state equations (Eqs. 15). $x_1$ represents both the ac and dc terms of inductor current. Since $$\left(-\frac{y}{R}\right)$$

is equal to the dc term near steady state, $$\left(x_1 + \frac{y}{R}\right)$$

represents the ac term which is the inductor ripple current.

The state equations, modified by the output adjuster with $Q>0$, become:

$$\dot{x}_1 = -\frac{Rx_2}{L(R+R_c)} - \left[R_s + \frac{RR_c}{(R+R_c)}\right]\frac{x_1}{L} + \quad \text{(Eqs. 20)}$$

$$\frac{R}{L(R+R_c)}[R_c x_1 + x_2]d + \frac{u_0}{L}d$$

$$\dot{x}_2 = -\frac{1}{C(R+R_c)}x_2 + \frac{R}{C(R+R_c)}[x_1(1-d)]$$

$$y' = \frac{1}{R+R_c}[(-R(R_c+Q))x_1 + (-R+Q)x_2].$$

A Taylor series linearization is performed on Eqs. 20 about the steady state $x_{10}$, $x_{20}$ and D resulting in a transfer function G(s), using the approximations $$R_s = 0,$$
$$x_{10} = \frac{u_0}{(1-D)^2 R},$$

and $$x_{20} = \frac{u_0}{(1-D)}.$$

With the further approximations: $R_c^2=0$ and $R_cQ=0$, with the additional assumption that R>Q, it is easily shown that the transfer function G(s) has a zero in the open left half plane if and only if $$(R_c + Q)C > \frac{\left(1 - \frac{Q}{R}\right)DL}{R(1-D)}.$$  (Eq. 21)

Eq. 21 is the Ridley condition for a buck-boost converter modified by an output adjuster with Q chosen so that R>Q. From Eq. 21, the output adjustment has a least two implications. First, the value of $R_c$ required by the usual Ridley condition is lowered. Second, the output ripple due to $R_c$ is reduced.

When the Ridley condition in Eq. 21 holds, then input-output feedback linearization is used to design the control condition for a buck-boost converter. Using a controller with controller gain factor k>0, the input-output feedback linearization results in a duty ratio $$d = \frac{-Py' - Sx_1 - Uu_0 - k(y' - y'_0)}{V}$$  (Eq. 22)

where $$y'_0 = y_0\left(1 - \frac{QD}{R(1-D)}\right)$$

$$P = -\frac{1}{R+R_c}\left[\frac{R^2(R_c+Q)}{L(R-Q)} + \frac{1}{C}\right],$$

$$S = \frac{R}{(R+R_c)^2}\left[\frac{(R_c+Q)}{L}\left(R_s + \frac{RR_c}{(R+R_c)}\right) - \frac{1}{C} - \frac{R^2(R_c+Q)^2}{L(R+R_c)(R-Q)}\right],$$

$$U = 0,$$

and $$V = \frac{R(R_c+Q)}{(R+R_c)}\left[\frac{R}{L}\left(-\frac{1}{(R-Q)}y' - \frac{(R+R_c)Q}{(R-Q)}x_1\right) + \frac{u_0}{L}\right] + \frac{(R-Q)R}{C(R+R_c)^2}x_1.$$

As output voltage ripple increases (or decreases) at particular desired output voltage $y_0$, higher (or lower) then the value of Q can be adjusted to stabilize the system.

In a preferred embodiment, the duty ratio d of Eq. 22 is applied as the control signal for the buck-boost converter. In other embodiments, various approximations to Eq. 22 can be used to determine the duty ratio d for the control signal.

In one embodiment of the buck-boost converter, a first approximation, including $R_c^2=0$, $R_cQ=0$ and $Q^2=0$, is applied to Eq. 22 to arrive at a duty ratio d given by the formula:

$$\frac{\left(\frac{R^2}{(R-Q)}(R_c+Q)C + L\right)y' +}{R\left[\frac{R}{(R-Q)}(R_c+Q)Cy' + L\frac{(R-Q)}{(R+R_c)}x_1 - (R+R_c)Cu_0\right]}.$$  (Eq. 23)

In another embodiment of the buck-boost converter, a second approximation including $$\frac{R}{R-Q} = 1$$

is applied to Eq. 23 to arrive at a duty ratio d given by the formula:

$$\frac{(R(R_c+Q)C+L)y' + (L-R_s(R_c+Q)C)Rx_1 + (R+R_c)LCk(y'_0 - y')]}{R\left((R_c+Q)Cy' + L\frac{R}{(R+R_c)}x_1 - (R_c+Q)Cu_0\right)}.$$  (Eq. 24)

Eq. 24 is valid when Q<<R.

In another set of embodiments of a buck-boost converter, Q is replaced by $$Q \rightarrow \frac{R}{(R+R_c)}Q,$$  (Eq. 25)

in Eq. 22, Eq. 23 and Eq. 24 to determine the duty ratio d and the adjusted output voltage is replaced by $$y' = y + \frac{R}{(R+R_c)}Q\left(x_1 + \frac{y}{R}\right).$$  (Eq. 26)

In these embodiments, Q is chosen so that $Q<(R+R_c)$.

In a preferred embodiment of a buck converter, buck converter circuit 300 is substituted for voltage converter circuit 402, and controller 420 uses LEM with switch off time sampling of the state variables. When the output adjuster is off, Q=0, y'=y, and the dynamic state equations for the buck converter are $$\dot{x}_1 = -\frac{Rx_2}{L(R+R_c)} - \left[R_s + \frac{RR_c}{(R+R_c)}\right]\frac{x_1}{L} + \frac{u_0}{L}d$$  (Eqs. 27)

$$\dot{x}_2 = -\frac{1}{C(R+R_c)}x_2 + \frac{R}{C(R+R_c)}x_1$$

-continued $$y = \frac{R}{R+R_c}[R_c x_1 + x_2]$$

where $x_1$ is the inductor current, $x_2$ is the voltage across capacitor C, $u_0$ is the input voltage, y is the output voltage and duty ratio d is the instantaneous duty ratio of the control signal. The dot above a variable means the time derivative of the variable.

Given a desired output voltage $y_0$, the equations $\dot{x}_1=0$, $\dot{x}_2=0$ and $y=y_0$ are solved to find the corresponding steady-state values $x_{10}$, $x_{20}$, with steady-state duty ratio D. The state space equilibrium point is ($x_{10}$, $x_{20}$); asymptotically stabilizing the system to this equilibrium point sends y asymptotically to $y_0$.

The buck converter is a linear system with an open left half plane zero at $-1/R_cC$ in its transfer function under LEM with switch off time sampling or TEM with switch on-time sampling. Input-output feedback linearization is employed using proportional control, generally with proportional, integral and derivative gain with controller gain factor k>0. For LEM with switch off time sampling, the input-output feedback linearization yields the formula for duty ratio:

$$d = \frac{(RR_CC+L)y - (L-R_SR_CC)Rx_1 + (R+R_C)LCk(y_0-y)}{RR_CCu_0}. \qquad \text{(Eq. 28)}$$

Generally, integral and derivative gain can also be implemented by the controller so that the controller gain factor takes the form $$k = (k_p + k_i/s + k_d s), \qquad \text{(Eq. 29)}$$

where $k_p$, $k_i$, and $k_d$ are the gains of the proportional, integral, and derivative terms of the controller and s is a complex variable. For example, an integral gain can be included to reduce steady state error. When the output adjuster is on with deltaE gain factor Q>0, the output adjuster changes the output y' used by the controller for control purposes according to $$y' = y + Q\left(x_1 - \frac{y}{R}\right) \qquad \text{(Eq. 30)}$$

where y is the output voltage in the state equations (Eqs. 27). $x_1$ represents both the ac and do terms of inductor current. Since y/R is equal to the dc term near steady state, then $x_1-y/R$ represents the ac term which is the inductor ripple current.

The state equations, modified by the output adjuster on with Q>0, become:

$$\dot{x}_1 = -\frac{Rx_2}{L(R+R_c)} - \left[R_s + \frac{RR_c}{(R+R_c)}\right]\frac{x_1}{L} + \frac{u_0}{L}d \qquad \text{(Eqs. 31)}$$

$$\dot{x}_2 = -\frac{1}{C(R+R_c)}x_2 + \frac{R}{C(R+R_c)}x_1$$

$$y' = \frac{1}{R+R_c}[(R(R_c+Q))x_1 + (R-Q)x_2].$$

This buck converter has an open left half plane zero in its transfer function at $$-\frac{1}{(R_c+Q)C} \qquad \text{(Eq. 32)}$$

Then input-output feedback linearization is used to design the control condition for a buck converter. Using a controller with controller gain factor k>0, the input-output feedback linearization results in a duty ratio $$d = \frac{-Py' - Sx_1 - Uu_0 - k(y' - y'_0)}{V} \qquad \text{(Eq. 33)}$$

where $y'_0 = y_0$, $$P = -\frac{1}{R+R_c}\left[\frac{R^2(R_c+Q)}{L(R-Q)} + \frac{1}{C}\right],$$

$$S = \frac{R}{(R+R_c)^2}\left[\frac{(R_c+Q)}{L}(-R_s(R+R_c) - RR_c) + \frac{(R+R_c)}{C} + R^2\frac{(R_c+Q)^2}{L(R-Q)}\right],$$

$$U = 0,$$

and $$V = \frac{R(R_c+Q)u_0}{L(R+R_c)}.$$

As output voltage ripple increases (or decreases) at particular desired output voltage $y_0$, higher (or lower) then the value of Q can be adjusted to stabilize the system.

In a preferred embodiment, the duty ratio d of Eq. 33 is applied as the control signal for the buck converter. In other embodiments, various approximations to Eq. 33 can be used to determine the duty ratio d for the control signal.

In one embodiment of the buck converter, a first approximation, including $R_c^2=0$, $R_cQ=0$ and $Q^2=0$, is applied to Eq. 33 to arrive at a duty ratio d given by the formula:

$$d = \frac{\left(\frac{R^2}{(R-Q)}(R_c+Q)C+L\right)y - (L-R_s(R_c+Q)C)Rx_1 + (R+R_c)LCk(y_0-y)}{R(R_c+Q)Cu_0}. \qquad \text{(Eq. 34)}$$

In another embodiment of the buck converter, a second approximation including $$\frac{R}{R-Q} = 1$$

is applied to Eq. 34 to arrive at a duty ratio d given by the formula:

$$d = \frac{(R(R_c+Q)C+L)y - (L-R_s(R_c+Q)C)Rx_1 + (R+R_c)LCk(y_0-y)]}{R(R_c+Q)Cu_0}. \qquad \text{(Eq. 35)}$$

Eq. 35 is valid when Q<<R.

In another set of embodiments of a buck converter, Q is replaced by $$Q \to \frac{R}{(R+R_c)}Q, \quad \text{(Eq. 36)}$$

in Eq. 33, Eq. 34 and Eq. 35 to determine the duty ratio d and the adjusted output voltage is replaced by $$y' = y + \frac{R}{(R+R_c)}Q\left(x_1 - \frac{y}{R}\right). \quad \text{(Eq. 37)}$$

In these embodiments, Q is chosen so that Q<(R+R$_c$).

In an alternate embodiment for a buck converter, buck converter circuit 300 uses TEM with switch on time sampling of the state variables. The state equations 27 and 31 and d equations 28, 33, 34, and 35 remain the same.

Figure 5:
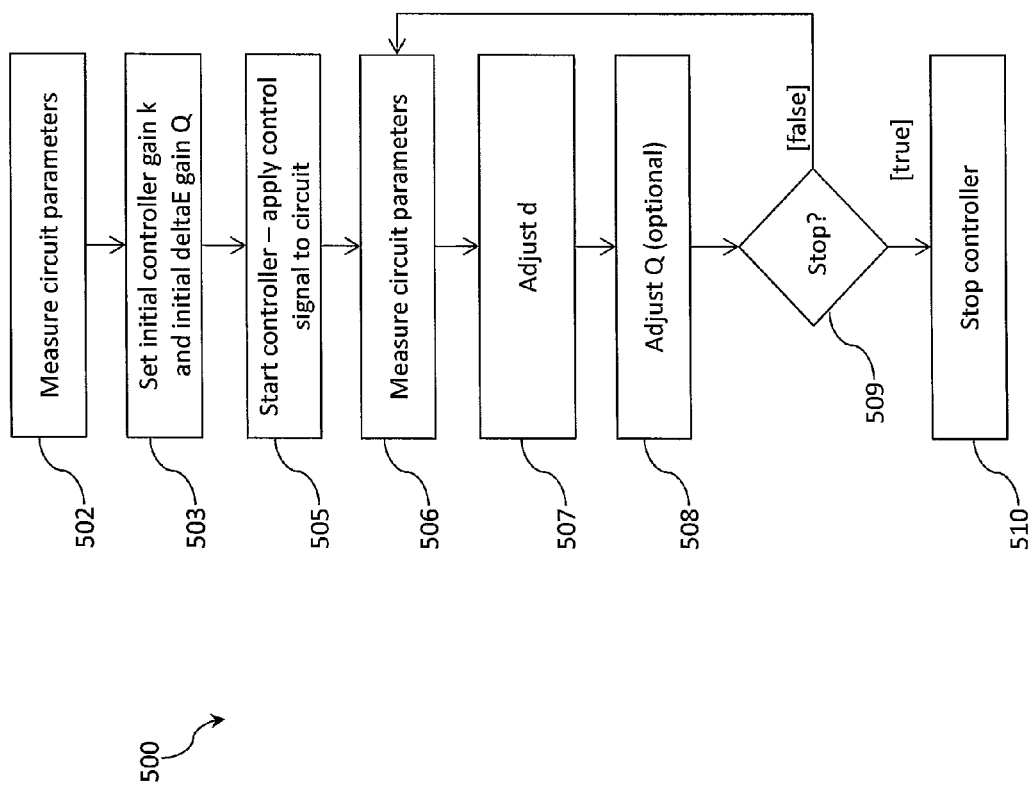
FIG. 5 is a flow chart of a method of operation for a preferred embodiment of a voltage converter.

Referring to FIG. 5, a method 500 for operation of a voltage converter is provided. The voltage converter includes a voltage converter circuit, an output adjuster, a controller and a voltage source supplying input voltage $u_0$. The method begins at step 502 where a set of parameters for the voltage converter circuit are determined including a load resistance. At step 503, an initial controller gain k is set to a pre-defined (proportional, integral and derivative) gain value and an initial value for the deltaE gain factor Q<R is set where R is the load resistance. For the embodiments of Eqs. 13, 25 and 36, Q<(R+R$_c$). At step 505, the controller is started applying the control signal to the voltage converter circuit using the initial duty ratio d and the initial value of the deltaE gain factor Q.

At step 506, the set of circuit parameters are dynamically measured. At step 507, the duty ratio d is dynamically adjusted based on the set of parameters, the controller gain factor k, and the deltaE gain factor Q. At step 508, Q may be dynamically adjusted, for example, based on any changes to the load resistance or based on inductor ripple. At step 509, a determination of a stop condition is made. If the stop condition is true, then at step 510, the voltage converter is stopped. If the stop condition is false, then the method continues performing steps 506, 507 and 508.

For a boost converter without an output adjuster, the Ridley condition in Eq. 4 should be satisfied. In the condition that (1−D) and R take on minimum values, the boost converter should operate at the highest output power the plant can support and a suitable value for R$_C$. The value for R$_C$ can be reduced only as the output voltage and output current are reduced.

In another embodiment for the boost converter, at step 503, Q is adjusted as follows. With R$_c$ being the equivalent series resistance (ESR) rating for the capacitor, Q satisfies the condition $$(R_C + Q)C > \frac{Ly_{max}}{R_{min}u_0}, \quad \text{(Eq. 38)}$$

where $$\frac{1}{1-D} = \frac{y}{u_0},$$

The inequality Eq. 38 is met, for example, if $$(R_C + Q)C = \beta\frac{Ly_{max}}{R_{min}u_0}, \quad \text{(Eq. 39)}$$

for some value of β>1. From Eq. 39, it is easily seen that the value of Q can be adjusted to a new value of Q, $Q_{new}$, while keeping β constant, for $$(R_C + Q_{new}) = \frac{y}{y_{max}}\frac{R_{min}}{R}(R_C + Q). \quad \text{(Eq. 40)}$$

Eq. 40 accounts for variation in the output voltage and in the output load current while maintaining the same factor β.

For a buck boost converter without an output adjuster, the Ridley condition in Eq. 16 should be satisfied. In the condition that D takes on a maximum value and R takes on a minimum value, the buck boost converter should operate at the highest output power the plant can support and a suitable value for R$_C$. The value for R$_C$ can be reduced only as the output voltage and output current are reduced.

In another embodiment for the buck boost converter, at step 503, Q is adjusted as follows. With R$_C$ being the equivalent series resistance (ESR) rating for the capacitor, Q satisfies the condition $$(R_C + Q)C > \frac{Ly_{max}}{R_{min}u_0}, \quad \text{(Eq. 41)}$$

where $$\frac{D}{1-D} = -\frac{y}{u_0},$$

The inequality Eq. 41 is met, for example, if $$(R_C + Q)C = \beta\frac{Ly_{max}}{R_{min}u_0}, \quad \text{(Eq. 42)}$$

for some value of β>1. From Eq. 42, it is easily seen that the value of Q can be adjusted to a new value of Q, $Q_{new}$, while keeping β constant, for $$(R_C + Q_{new}) = \frac{y}{y_{max}}\frac{R_{min}}{R}(R_C + Q). \quad \text{(Eq. 43)}$$

Eq. 40 accounts for variation in the output voltage and in the output load current while maintaining the same factor β.

In deriving equations 40 and 43, the approximation Q<<R is made and changes in the input voltage $u_0$ are not accounted for. Where the input voltage is not constant, the value of D will change which also affects the adjustment of Q. A suitable analysis similar to the analysis provided in Equations 38-43 will yield equations for the adjustment of Q when input voltage changes.

The controller is implemented according to one of a group of: a discrete electronics circuit; a set of programmed instructions embodied in an FPGA; a set of programmed instructions embodied in a digital signal processor; a microcontroller; a set of programmed instructions embodied in an ASIC; and combinations thereof. A suitable hardware platform includes clocking circuits, a CPU (if required), a non-volatile memory for storing the programmed instructions, a volatile memory for storing intermediate results and for storing calculated parameters for the controller and suitable input/output controls for starting, stopping and entering parameters related to the function of the controller.

The output adjuster is also implemented according to one of a group of: a discrete electronics circuit; a set of programmed instructions embodied in an FPGA; a set of programmed instructions embodied in a digital signal processor; a microcontroller; a set of programmed instructions embodied in an ASIC; and combinations thereof. A suitable hardware platform includes clocking circuits, a CPU (if required), a non-volatile memory for storing the programmed instructions, a volatile memory for storing intermediate results and for storing calculated parameters for the output adjuster and suitable input/output controls for starting, stopping and entering parameters related to the function of the output adjuster.

For example, in a preferred embodiment, a digital signal processor and a computer program stored on a computer readable medium is provided for programming the digital signal processor to implement the controller and the output adjuster as disclosed. The digital signal processor in operation performs the function of determining the adjusted output y', determining Q and providing the control signal at the duty ratio d according to the equations for duty ratio disclosed, the gain k and the type of voltage converter implemented.

In an embodiment utilizing analog control instead of digital control, the controller is replaced by an analog PID controller with analog inputs for $u_0$, $y_0$, $x_1$, Q, and y'. Output adjuster is replaced by an analog circuit implementing Eq. 7 for a boost converter, Eq. 19 for a buck-boost converter and Eq. 37 for a buck controller where the load resistance R and current $x_1$ is measured and converted to corresponding voltages.

It should also be understood, that the output adjuster of the present disclosure can be made as an add-on component for power control circuits to reduce ripple where the output adjuster is added at design time or as a retrofit to an existing power control circuit.

The embodiments presented in this disclosure are intended to provide implementable examples of the present invention, but are not intended to limit the present invention. For instance, the control method provided by input-output feedback linearization with leading edge modulation with switch off time sampling is meant as an example control method. The controller can utilize any control method based on many different control theories.

The invention claimed is:

1. A voltage converter for converting an input voltage to an output voltage across a load resistance comprising:
a voltage converter circuit having an inductor;
an output adjuster, connected to the voltage converter circuit, configured to generate an adjusted output voltage based on the output voltage and a time varying component of an inductor current through the inductor, scaled by a first adjustable gain factor;
a controller, connected to the output adjuster and the voltage converter circuit, configured to generate a control signal to the voltage converter circuit;
the control signal having a duty ratio based on the adjusted output voltage, the input voltage, a desired output voltage, a second gain factor, the inductor current and the first adjustable gain factor;
whereby the voltage converter circuit changes the output voltage to match the desired output voltage; and, wherein the adjusted output voltage is generated according to $$y' = y + Q\left(x_1 - \frac{y}{R}\right),$$

where y' is the adjusted output voltage, y is the output voltage, Q is the first adjustable gain factor, $x_1$ is the inductor current and R is the load resistance.

2. The voltage converter of claim 1 wherein the voltage converter circuit comprises:
a boost converter circuit where the inductor is connected to a first polarity of the input voltage in series with a series resistance;
the boost converter circuit further comprising:
a first switch connected in series with the inductor and a second polarity of the input voltage and controlled by the control signal;
a second switch connected between the inductor and a capacitor;
the capacitor connected by a capacitive resistance to the second polarity of the input voltage;
the load resistance connected in parallel to the capacitor and the capacitive resistance; and,
the duty ratio of the control signal is given by the formula:

$$d = \frac{[R(R_c + Q)C + L]y' - (L - R_s(R_c + Q)C)Rx_1 - R(R_c + Q)Cu_0 + (R + R_c)LCk(y'_0 - y')}{R\left((R_c + Q)Cy' - \frac{LR}{(R + R_c)}x_1\right)},$$

where R is the load resistance, $R_c$ is the capacitive resistance, Q is the first adjustable gain factor, k is the second gain factor, C is the capacitance of the capacitor, L is the inductance of the inductor, $R_s$ is the series resistance, $u_0$ is the input voltage, y' is the adjusted output voltage, $x_1$ is the inductor current, $$y'_0 = y_0\left(1 + \frac{QD}{R(1-D)}\right)$$

and $y_0$ is the desired output voltage.

3. The voltage converter of claim 2 wherein the duty ratio of the control signal is given by the formula:

$$d = \frac{\left(\frac{R^2}{(R-Q)}(R_c + Q)C + L\right)y' - (L - R_s(R_c + Q)C)Rx_1 - R(R_c + Q)Cu_0 + (R + R_c)LCk(y'_0 - y')}{R\left(\frac{R}{(R-Q)}(R_c + Q)Cy' - \frac{L(R-Q)}{(R + R_c)}x_1\right)}.$$

4. The voltage converter of claim 2 wherein the duty ratio of the control signal is given by the formula:

$$d = \frac{-Py' - Sx_1 - Uu_0 - k(y' - y'_0)}{V}$$

-continued where $$P = -\frac{1}{R+R_c}\left[\frac{R^2(R_c+Q)}{L(R-Q)} + \frac{1}{C}\right],$$

$$S = \frac{R}{(R+R_c)^2}\left[\frac{(R_c+Q)}{L}(-R_s(R+R_c) - RR_c) + \frac{(R+R_c)}{C} + R^2\frac{(R_c+Q)^2}{L(R-Q)}\right],$$

$$U = \frac{R}{L(R+R_c)}(R_c+Q),$$

and $$V = \frac{R}{(R+R_c)^2}\left[-\left(\frac{R(R_c+Q)Q(R+R_c)}{L(R-Q)} + \frac{(R-Q)}{C}\right)x_1 + \frac{R(R_c+Q)(R+R_c)}{L(R-Q)}y'\right].$$

5. The voltage converter of claim 1 wherein the voltage converter circuit comprises:
   a buck converter circuit further comprising:
      a first switch connected in series with a first polarity of the input voltage and controlled by the control signal;
      the inductor having a series resistance connected in series with the first switch and a second polarity of the input voltage;
      a second switch connected between the first switch and a capacitor;
      the capacitor connected by a capacitive resistance to the second polarity of the input voltage;
      the load resistance connected in parallel to the capacitor and the capacitive resistance; and,
      the duty ratio of the control signal is given by the formula:

$$d = \frac{(R(R_c+Q)C+L)y' - (L-R_s(R_c+Q)C)Rx_1 + (R+R_c)LCk(y'_0 - y')}{R(R_c+Q)Cu_0}$$

where R is the load resistance, $R_c$ is the capacitive resistance, Q is the first adjustable gain factor, k is the second gain factor, C is the capacitance of the capacitor, L is the inductance of the inductor, $R_s$ is the series resistance, $u_0$ is the input voltage, y' is the adjusted output voltage, $x_1$ is the inductor current, and $y'_0$ is equal to the desired output voltage.

6. The voltage converter of claim 5 wherein the duty ratio of the control signal is given by the formula:

$$d = \frac{\left(\frac{R^2}{(R-Q)}(R_c+Q)C+L\right)y' - (L-R_s(R_c+Q)C)Rx_1 + (R+R_c)LCk(y'_0 - y')}{R(R_c+Q)Cu_0}.$$

7. The voltage converter of claim 5 wherein the duty ratio of the control signal is given by the formula:

$$d = \frac{-Py' - Sx_1 - Uu_0 - k(y' - y'_0)}{V}$$

where $$P = -\frac{1}{R+R_c}\left[\frac{R^2(R_c+Q)}{L(R-Q)} + \frac{1}{C}\right],$$

$$S = \frac{R}{(R+R_c)^2}\left[\frac{(R_c+Q)}{L}(-R_s(R+R_c) - RR_c) + \frac{(R+R_c)}{C} + R^2\frac{(R_c+Q)^2}{L(R-Q)}\right],$$

$$U = 0,$$

and $$V = \frac{R(R_c+Q)u_0}{L(R+R_c)}.$$

8. A voltage converter for converting an input voltage to an output voltage across a load resistance comprising:
   a voltage converter circuit having an inductor;
   an output adjuster, connected to the voltage converter circuit, configured to generate an adjusted output voltage based on the output voltage and a time varying component of an inductor current through the inductor, scaled by a first adjustable gain factor;
   a controller, connected to the output adjuster and the voltage converter circuit, configured to generate a control signal to the voltage converter circuit;
   the control signal having a duty ratio based on the adjusted output voltage, the input voltage, a desired output voltage, a second gain factor, the inductor current and the first adjustable gain factor;
   whereby the voltage converter circuit changes the output voltage to match the desired output voltage; and,
   wherein:
      the voltage converter circuit further comprises a capacitor having a capacitive resistance and connected in parallel to the load resistance; and,
      the adjusted output voltage is generated according to $$y' = y + \frac{R}{(R+R_c)}Q\left(x_1 - \frac{y}{R}\right),$$

where y' is the adjusted output voltage, y is the output voltage, Q is the first adjustable gain factor, $x_1$ is the inductor current, R is the load resistance and $R_c$ is the capacitive resistance.

9. A voltage converter for converting an input voltage to an output voltage across a load resistance comprising:
   a voltage converter circuit having an inductor;
   an output adjuster, connected to the voltage converter circuit, configured to generate an adjusted output voltage based on the output voltage and a time varying component of an inductor current through the inductor, scaled by a first adjustable gain factor;
   a controller, connected to the output adjuster and the voltage converter circuit, configured to generate a control signal to the voltage converter circuit;
   the control signal having a duty ratio based on the adjusted output voltage, the input voltage, a desired output voltage, a second gain factor, the inductor current and the first adjustable gain factor;
   whereby the voltage converter circuit changes the output voltage to match the desired output voltage; and,
   wherein the adjusted output voltage is generated according to $$y' = y + Q\left(x_1 + \frac{y}{R}\right),$$

where y' is the adjusted output voltage, y is the output voltage, Q is the first adjustable gain factor, $x_1$ is the inductor current and R is the load resistance.

10. The voltage converter of claim 9 wherein the voltage converter circuit comprises:
   a buck-boost converter circuit further comprising:
     a first switch connected in series with a first polarity of the input voltage and controlled by the control signal;
     the inductor having a series resistance connected in series with the first switch and a second polarity of the input voltage;
     a second switch connected between the first switch and a capacitor;
     the capacitor connected by a capacitive resistance to the second polarity of the input voltage;
     the load resistance connected in parallel to the capacitor and the capacitive resistance; and,
     the duty ratio of the control signal is given by the formula:

$$d = \frac{(R(R_c + Q)C + L)y' + (L - R_s(R_c + Q)C)Rx_1 + (R + R_c)LCk(y'_0 - y')]}{R\left((R_c + Q)Cy' + \frac{LR}{(R + R_c)}x_1 - (R_c + Q)Cu_0\right)}$$

where R is the load resistance, $R_c$ is the capacitive resistance, Q is the first adjustable gain factor, k is the second gain factor, C is the capacitance of the capacitor, L is the inductance of the inductor, $R_s$ is the series resistance, $u_0$ is the input voltage, y' is the adjusted output voltage, $x_1$ is the inductor current, $$y'_0 = y_0\left(1 - \frac{QD}{R(1 - D)}\right)$$

and $y_0$ is the desired output voltage.

11. The voltage converter of claim 10 wherein the duty ratio of the control signal is given by the formula:

$$d = \frac{\left(\frac{R^2}{(R-Q)}(R_c + Q)C + L\right)y' + (L - R_s(R_c + Q)C)Rx_1 + (R + R_c)LCk(y'_0 - y')}{R\left[\frac{R}{(R-Q)}(R_c + Q)Cy' + L\frac{(R-Q)}{(R+R_c)}x_1 - (R + R_c)Cu_0\right]}.$$

12. The voltage converter of claim 10 wherein the duty ratio of the control signal is given by the formula:

$$d = \frac{-Py' - Sx_1 - Uu_0 - k(y' - y'_0)}{V}$$

where $$P = -\frac{1}{R + R_c}\left[\frac{R^2(R_c + Q)}{L(R - Q)} + \frac{1}{C}\right],$$

$$S = \frac{R}{(R + R_c)}\left[\frac{(R_c + Q)}{L}\left(R_s + \frac{RR_c}{(R + R_c)}\right) - \frac{1}{C} - \frac{R^2(R_c + Q)^2}{L(R + R_c)(R - Q)}\right],$$

$U = 0$, and $$V = -\frac{R(R_c + Q)}{(R + R_c)}\left[\frac{R}{L}\left(-\frac{1}{(R-Q)}y' - \frac{(R + R_c)Q}{(R-Q)}x_1\right) + \frac{u_0}{L}\right] + \frac{(R - Q)R}{C(R + R_c)^2}x_1.$$

13. A method of converting an input voltage into an output voltage across a load resistance comprising:
   providing a voltage converter circuit having the input voltage as a voltage source and producing the output voltage;
   providing an inductor current flowing through an inductor in the voltage converter circuit, the inductor current having a time varying component;
   providing an output adjuster connected to the voltage converter circuit;
   generating an adjusted output voltage which depends on the output voltage and the time varying component of the inductor current scaled by a first adjustable gain factor;
   providing a controller connected to the output adjuster and to the voltage converter circuit;
   generating a control signal with a duty ratio that controls the voltage converter circuit;
   dynamically determining the duty ratio from the adjusted output voltage, the input voltage, a desired output voltage, a second gain factor, the inductor current and the first adjustable gain factor;
   whereby the voltage converter circuit produces the output voltage to match the desired output voltage; and,
   generating the adjusted output voltage according to one of a first equation, a second equation, a third equation, and a fourth equation,
   the first equation comprising $$y' = y + Q\left(x_1 - \frac{y}{R}\right),$$

where y' is the adjusted output voltage, y is the output voltage, Q is the first adjustable gain factor, $x_1$ is the inductor current and R is the load resistance;
   the second equation comprising $$y' = y + Q\left(x_1 + \frac{y}{R}\right),$$

where y' is the adjusted output voltage, y is the output voltage, Q is the first adjustable gain factor, $x_1$ is the inductor current and R is the load resistance;
   the third equation comprising $$y' = y + \frac{R}{(R + R_c)}Q\left(x_1 - \frac{y}{R}\right),$$

where y' is the adjusted output voltage, y is the output voltage, Q is the first adjustable gain factor, $x_1$ is the inductor current, R is the load resistance and $R_c$ is a capacitive resistance of a capacitor in parallel with the load resistance; and, the fourth equation comprising $$y' = y + \frac{R}{(R+R_c)} Q\left(x_1 + \frac{y}{R}\right),$$

where y' is the adjusted output voltage, y is the output voltage, Q is the first adjustable gain factor, $x_1$ is the inductor current, R is the load resistance and $R_c$ is a capacitive resistance of a capacitor in parallel with the load resistance.

* * * * *